(12) United States Patent
Lee et al.

(10) Patent No.: US 8,031,022 B2
(45) Date of Patent: Oct. 4, 2011

(54) OSCILLATION CIRCUIT INCLUDING MIT DEVICE AND METHOD OF ADJUSTING OSCILLATION FREQUENCY OF THE OSCILLATION CIRCUIT

(75) Inventors: Yong-Wook Lee, Daejeon (KR);
Bong-Jun Kim, Daegeon (KR);
Hyun-Tak Kim, Daejeon (KR);
Sung-Youl Choi, Ulsan (KR);
Byung-Gyu Chae, Daejeon (KR);
Jung-Wook Lim, Daejeon (KR);
Sun-Jin Yun, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 7 days.

(21) Appl. No.: 12/531,058

(22) PCT Filed: Mar. 5, 2008

(86) PCT No.: PCT/KR2008/001245
§ 371 (c)(1),
(2), (4) Date: Sep. 11, 2009

(87) PCT Pub. No.: WO2008/111756
PCT Pub. Date: Sep. 18, 2008

(65) Prior Publication Data
US 2010/0085126 A1    Apr. 8, 2010

(30) Foreign Application Priority Data
Mar. 12, 2007  (KR) .................. 10-2007-0024213
Jul. 31, 2007   (KR) .................. 10-2007-0077170

(51) Int. Cl.
*H03B 11/00*    (2006.01)
(52) U.S. Cl. .................. 331/165; 331/107 R; 331/173; 331/187; 327/596

(58) Field of Classification Search ............... 331/65, 331/87, 107 R, 165, 166, 172, 174, 187; 257/173–175, 310, 368; 327/596; 438/2, 438/301
See application file for complete search history.

(56) References Cited

U.S. PATENT DOCUMENTS
3,731,249 A * 5/1973 Lipsicas et al. ............... 338/325
(Continued)

FOREIGN PATENT DOCUMENTS
JP        05-191144 A        7/1993
(Continued)

OTHER PUBLICATIONS

A. Maeda et al., "Evidence for the existence of the inherent periodicity in the switched state at low temperatures in $K_{0.3}MoO_3$", Phys. Rev. B, vol. 36, No. 14, pp. 7709-7711 (1987).
(Continued)

*Primary Examiner* — Levi Gannon
(74) *Attorney, Agent, or Firm* — Rabin & Berdo, P.C.

(57) ABSTRACT

Provided are an MIT device-based oscillation circuit including a power source, an MIT device and a variable resistor, in which a generation of an oscillation and an oscillation frequency are determined according to a voltage applied from the power source and a resistance of the variable resistor, and a method of adjusting the oscillation frequency of the oscillation circuit. The MIT device includes an MIT thin film and an electrode thin film connected to the MIT thin film, and generates a discontinuous MIT at an MIT generation voltage, the variable resistor is connected in series to the MIT device, and the power source applies a voltage or an electric current to the MIT device. The generation of an oscillation and an oscillation frequency are determined according to the voltage applied from the power source and the resistance of the variable resistor.

17 Claims, 6 Drawing Sheets

U.S. PATENT DOCUMENTS

| | | | |
|---|---|---|---|
| 6,365,913 | B1 | 4/2002 | Misewich et al. |
| 6,555,393 | B2 | 4/2003 | Schrott et al. |
| 6,624,463 | B2 | 9/2003 | Kim et al. |
| 6,987,290 | B2 | 1/2006 | Kim et al. |
| 2005/0098836 | A1* | 5/2005 | Kim et al. ............ 257/379 |
| 2006/0011942 | A1 | 1/2006 | Kim et al. |

FOREIGN PATENT DOCUMENTS

| | | |
|---|---|---|
| KR | 2004-0099797 A | 12/2004 |
| KR | 2004-0104773 A | 12/2004 |
| KR | 2005-0038834 | 4/2005 |
| KR | 2005-0043431 A | 5/2005 |
| KR | 2006-0006195 A | 1/2006 |
| KR | 2006-0093266 A | 8/2006 |
| KR | 2006-0101208 A | 9/2006 |
| KR | 0668347 * | 1/2007 |
| KR | 2007-0115571 | 12/2007 |
| WO | WO-2004-105139 A1 | 12/2004 |
| WO | WO-2005-041308 | 5/2005 |
| WO | WO-2006-088323 A1 | 8/2006 |

OTHER PUBLICATIONS

Gunn, J. B., "Microwave oscillations of current in III-V semiconductors", Solid State Communications, vol. 1, pp. 88-91, 1963.

F. Sawano et al., "An organic thyristor", Nature, vol. 437, pp. 522-524 (Sep. 22, 2005).

* cited by examiner

OSCILLATION CIRCUIT INCLUDING MIT DEVICE AND METHOD OF ADJUSTING OSCILLATION FREQUENCY OF THE OSCILLATION CIRCUIT

TECHNICAL FIELD

The present invention relates to a metal-insulator transition (MIT) device, and more particularly, an oscillation circuit including an MIT device, which can control oscillation generation and oscillation frequency, and a method of adjusting the oscillation frequency of the oscillation circuit.

BACKGROUND ART

Research into about insulators, the resistance of which varies according to an externally applied voltage, has been actively performed. In particular, the abrupt transition in a metal-insulator transition (MIT) material from an insulator to a metal has been researched through experiments (Hyuntak Kim, et. al., New Journal of Physics, vol. 6, p 52, 2004). An MIT material can be fabricated as a device having two terminals or three terminals by being deposited on a substrate and forming electrodes, and the MIT device can be applied to various electronic devices. For example, a patent disclosing an application of an MIT material as a field effect transistor (FET) has been registered (U.S. Pat. No. 6,624,463 B2, US registered patent, Oct. 23, 2003, Hyuntak Kim et. al.).

An MIT device shows a characteristic that an electric current increases abruptly and discontinuously (or a resistance reduces rapidly) when a voltage applied to the MIT device reaches a certain level (hereinafter, referred to as MIT generation voltage) or higher, and is transited from an insulator status to a metal status. The electrical characteristics of MIT devices can be applied in various ways and MIT devices can be used in various electric and electronic devices. However, there has been no instance of applying an MIT device to an oscillation phenomenon.

In this regard, research into oscillation characteristics of the voltage and current has been performed. That is, the oscillation characteristics of the voltage and current that is referred to as a Gunn effect in Group III-V semiconductor materials has been reported, and the oscillation has been described as being generated by a mobility of electric charges.

In addition, in a field of semiconductor oxides, when a circuit is constructed by connecting a material such as $K_{0.3}MoO_3$ and a resistor in series and a direct current (DC) voltage is applied to the circuit, an oscillation occurs in the electric current of the circuit. This phenomenon has been reported as being generated by a sliding motion of a charge-density wave. This oscillation characteristic is generated a low temperature around 20K, and the oscillation frequency is changed according to a magnitude of the applied voltage.

Recently, the oscillation of an organic material has also been reported, that is, when a circuit is constructed by directly contacting a conductive organic salt material, a resistance of which is greatly changed according to an external applied voltage, to a thin film resistor and an external voltage of a certain degree or higher is applied to the circuit, an oscillation occurs in the current flowing in the circuit. The change in the resistance of the conductive organic salt is caused by a change in a charge ordering.

The oscillation of the Group III-V material and the organic material is caused only when the external voltage is applied to the material, and a waveform of the oscillation is a sinusoidal wave that is continuously changed. In addition, the oscillation of the oxide material only occurs at a low temperature, while the oscillation frequency can be controlled. Moreover, the oscillation frequency generated from the oscillation device using the organic material is very low.

In addition, in order to realize a conventional oscillation device, for example, an inverter or an oscillator, an amplifier, a switching circuit, and a feedback loop should be constructed. In order to form the amplifier, the switching circuit, and the feedback loop, various electronic devices such as a transistor, a capacitor, and an inductor are required in addition to the resistor. Therefore, there is a limitation in minimizing a conventional oscillation device using the various electronic devices described above, and fabrication costs of the oscillation device also increase.

DISCLOSURE OF INVENTION

Technical Problem

The present invention provides an oscillation circuit including a metal-insulator transition (MIT) device, in which oscillation generation and oscillation frequency are determined according to an applied voltage and a resistance of a variable resistor included in the oscillation circuit, and a method of adjusting the oscillation frequency of the oscillation circuit.

Technical Solution

According to an aspect of the present invention, there is provided a metal-insulator transition (MIT) device-based oscillation circuit comprising: an MIT device comprising an MIT thin film and an electrode thin film connected to the MIT thin film, and generating a discontinuous MIT at an MIT generation voltage; a variable resistor connected in series to the MIT device; and a power source applying a voltage or an electric current to the MIT device, wherein the generation of an oscillation and an oscillation frequency in oscillation circuit are determined according to the voltage applied by the power source to the MIT device and the resistance of the variable resistor.

The oscillation circuit may further comprise: at least one of a capacitor and an inductor that is connected to at least one of the power source, the MIT device, and the variable resistor in series or in parallel, or in series and in parallel. The power source may be one selected from a direct current (DC) voltage source, an alternating current (AC) voltage source, a pulse voltage source, a DC current source, an AC current source, and a pulse current source.

The applied voltage and the resistance for generating the oscillation in the oscillation circuit may be included in a predetermined range, wherein the voltage applied to the MIT device is equal to the MIT generation voltage or higher. In addition, a current flowing through the oscillation circuit when the discontinuous MIT may be generated in the MIT device is between a minimum current and a maximum current that can generate the discontinuous MIT. In other words, the applied voltage and the resistance for generating the oscillation in the oscillation circuit may be included in a predetermined range, wherein the voltage applied to the MIT device is equal to the MIT generation voltage or higher, and simultaneously, a current flowing through the oscillation circuit when the discontinuous MIT may be generated in the MIT device is between a minimum current and a maximum current that can generate the discontinuous MIT.

The oscillation frequency of an oscillation waveform of the oscillation generated in the oscillation circuit may vary according to a change in at least one of the applied voltage and the resistance. When at least one of a capacitor and an inductor is connected to the oscillation circuit, the oscillation frequency of the oscillation circuit may vary according to a change in at least one of a capacitance of the capacitor and an inductance of the inductor.

The MIT device may include a first electrode thin film, an MIT thin film and a second electrode thin film, which are sequentially formed on a substrate. Alternatively, the MIT device may include a first electrode thin film and a second electrode thin film, which are formed on first and second side surfaces of the MIT thin film on the substrate.

The electronic device, the electronic apparatus, or the electronic system may comprise at least one of an MIT battery, an MIT light emission device, an MIT sensor, an MIT two-terminal switching device, an MIT three-terminal switching device (transistor), an MIT memory, an MIT oscillator, and an MIT radio frequency (RF) device.

According to another aspect of the present invention, there is provided a method of adjusting an oscillation frequency of the oscillation circuit, the method comprising: controlling a generation of an oscillation of the oscillation circuit and adjusting the oscillation frequency of the oscillation circuit by controlling an applied voltage of the power source and the resistance of the variable resistor to satisfy predetermined conditions.

The applied voltage and the resistance for generating the oscillation by the oscillation circuit may be included in a predetermined range, wherein the voltage applied to the MIT device is equal to or higher than the MIT generation voltage and a current flowing through the oscillation circuit when the discontinuous MIT is generated in the MIT device is between a minimum current and a maximum current that can generate the discontinuous MIT.

The oscillation frequency of the oscillation waveform of the oscillation generated in the oscillation circuit may vary according to a change in at least one of the applied voltage of the power source and the resistance of the variable resistor. When at least one of a capacitor and an inductor is connected to the oscillation circuit, the oscillation frequency of the oscillation circuit may vary according to a change in at least one of a capacitance of the capacitor and an inductance of the inductor.

According to the MIT device based oscillation circuit that can adjust the oscillation frequency and the method of adjusting the oscillation frequency of the present invention, the applied voltage or the resistance are controlled according to certain conditions in order to generate and terminate the oscillation and to continuously change the oscillation frequency. Thus, present invention can be directly applied to an inverter or an oscillator, and can be useful in an electronic device requiring a wide oscillation frequency band.

Advantageous Effects

According to the MIT device based oscillation circuit that can adjust the oscillation frequency and the method of adjusting the oscillation frequency of the present invention, the applied voltage or the resistance are controlled according to certain conditions in order to generate and terminate the oscillation and to continuously change the oscillation frequency. The conditions of generating the oscillation and the method of adjusting the oscillation frequency can be applied to all kinds of oscillation circuits including MIT devices in order to generate oscillation and adjust the oscillation frequency.

Therefore, the present invention can be directly applied to an inverter or an oscillator, and can be useful in an electronic device, apparatus, or system requiring a wide oscillation frequency band. In addition, the present invention also can be applied in devices using MIT such as MIT solar batteries and MIT illumination devices.

Moreover, in order to form an inverter or oscillator, many electronic devices such as an amplifier, a switching circuit, and a feedback loop are required; however, the MIT device based oscillation circuit according to the present invention can easily obtain the oscillation characteristic only by connecting a variable resistor to the MIT device. In particular, a high oscillation frequency of hundreds of kHz can be generated by changing the applied voltage or the resistance of the variable resistor, and the such oscillation frequency can be adjusted continuously.

DESCRIPTION OF DRAWINGS

The above and other features and advantages of the present invention will become more apparent by describing in detail exemplary embodiments thereof with reference to the attached drawings in which.

BEST MODE

Figure 1:
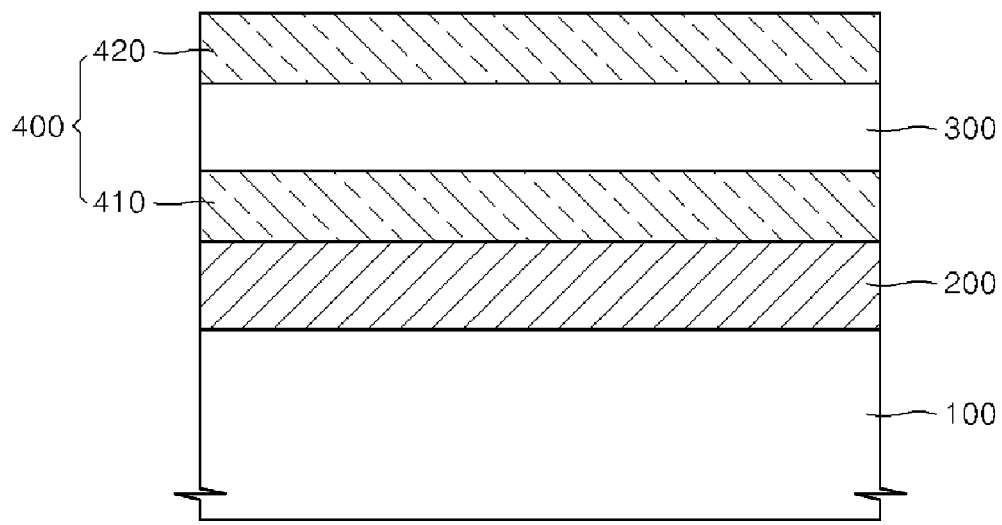
FIG. 1 is a cross-sectional view of a perpendicular metal-insulator transition (MIT) device according to an embodiment of the present invention.

The present invention will now be described more fully with reference to the accompanying drawings, in which exemplary embodiments of the invention are shown. In the drawings, the thicknesses of layers and regions are exaggerated for clarity. It will also be understood that when a layer is referred to as being 'on' another layer or substrate, it can be directly on the other layer or substrate, or intervening layers may also be present. Like reference numerals in the drawings denote like elements, and thus their description will be omitted. The invention may, however, be embodied in many different forms and should not be construed as being limited to the embodiments set forth herein; rather, these embodiments are provided so that this disclosure will be thorough and complete, and will fully convey the concept of the invention to those skilled in the art. Terms used in this specification are just used to describe the present invention, not used to define meanings or limit the scope of the present invention disclosed in claims.

FIG. 1 is a cross-sectional view of a metal-insulator transition (MIT) device having a perpendicular structure, according to an embodiment of the present invention.

Referring to FIG. 1, the MIT device having the perpendicular structure according to the current embodiment of the present invention includes a substrate 100, a buffer layer 200 formed on the substrate 100, a first electrode thin film 410 formed on the buffer layer 200, an MIT thin film 300 formed on the first electrode thin film 410, and a second electrode thin film 420 formed on the MIT thin film 300. The first electrode thin film 410 and the second electrode thin film 420 together constitute an electrode thin film 400.

The buffer layer 200 reduces a lattice mismatch between the substrate 100 and the first electrode thin film 410. If the lattice mismatch between the substrate 100 and the first electrode thin film 410 is very small or insignificant, the first electrode thin film 410 can be directly formed on the substrate 100 without interposing the buffer layer 200. The buffer layer 200 can include a $SiO_2$ layer or a $Si_3N_4$ layer.

The MIT thin film 300 can include at least one of a p-type inorganic semiconductor, a p-type inorganic insulator, a p-type organic semiconductor, and a p-type organic insulator, having a low hole concentration and can be formed of an MIT thin film material including at least one of oxygen, carbon, Si, Ge, a Group III-V or II-VI semiconductor compound, a transition metal element, a rare earth element, and a lanthanum based element. For example, the MIT thin film 300 can be formed of a semiconductor material such as GaAS, GaSb, InP, InAs, GST (GeSbTe) compound, Si, or Ge. On the other hand, the MIT thin film 300 can include an n-type semiconductor having a high resistance and an insulator. Here the hole concentration is about $3\times10^{16}$ $cm^{-3}$.

In more detail, the MIT thin film 300 can include an oxide layer material including at least one of $Al_2O_3$, $VO_2$, $V_2O_3$, $ZrO_2$, $ZnO$, $HfO_2$, $CuO$, $Ta_2O_5$, $La_2O_3$, $Fe_2O_3$, $NiO$, and $MgO$, an oxide layer material including at least one of $Al_xTi_yO$, $Zn_xTi_yO$, $Zr_xTi_yO$, $Ta_xTi_yO$, $V_xTi_yO$, $La_xTi_yO$, $Ba_xTi_yO$, and $Sr_xTi_yO$, and a semiconductor material including at least one of GaAS, GaSb, InP, InAs, GST (GeSbTe), Si, and Ge.

The MIT thin film 300 can be formed using at least one of a sputtering method, molecular beam epitaxy (MBE), e-beam evaporation, thermal evaporation, atomic layer epitaxy (ALE), pulsed laser deposition (PLD), chemical vapor deposition (CVD), Sol-Gel method, and atomic layer deposition (ALD).

The electrode thin film 400 can include at least one of Al, Cu, Ni, W, Mo, Cr, Zn, Mg, Fe, Co, Sn, Pb, Au, Ag, Pt, Ti, Ta, TaN, TaW, WN, TiN, TiW, poly-Si, and an oxide material electrode. Here, the oxide material electrode can be, for example, IrO, RuO, InSnO(InO:Sn), or ZnO.

The substrate 100 can be formed of at least one of Si, $SiO_2$, GaAs, $Al_2O_3$, plastic, glass, $V_2O_5$, $PrBa_2Cu_3O_7$, $YBa_2Cu_3O_7$, MgO, $SrTiO_3$, $SrTiO_3$ doped with Nb, and silicon on an insulating thin film (SOI).

Figure 2A:
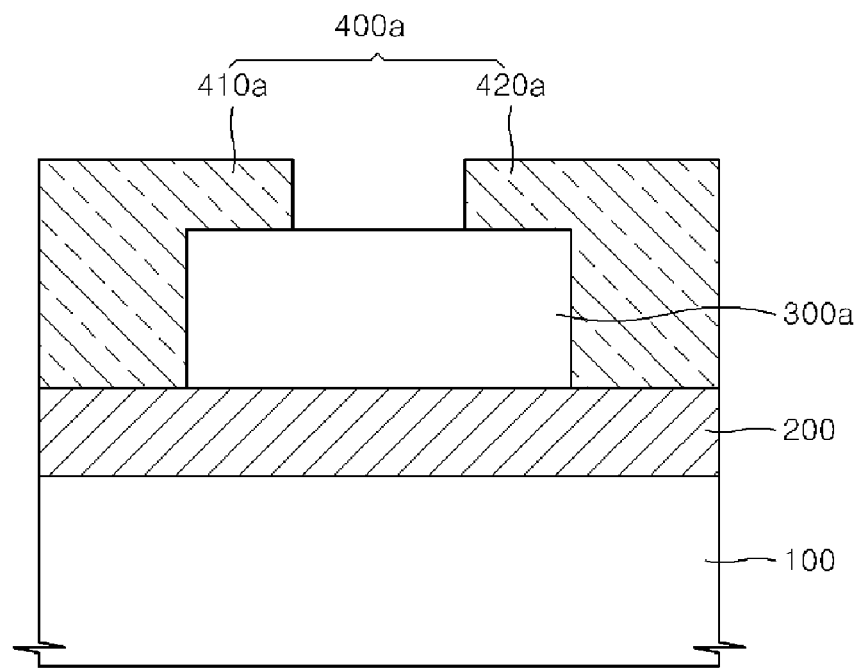
FIGS. 2A and 2B are a cross-sectional view and a plan view of a horizontal MIT device, respectively, according to embodiments of the present invention.

FIG. 2A is a cross-sectional view of an MIT device having a horizontal structure, according to an embodiment of the present invention.

Referring to FIG. 2A, the MIT device having the horizontal structure according to the current embodiment of the present invention includes a substrate 100, a buffer layer 200 formed on the substrate 100, an MIT thin film 300a formed on a portion of an upper surface of the buffer layer 200, and a first electrode thin film 410a and a second electrode thin film 420a that are formed on a side surface and an upper surface of the MIT thin film 300a to face each other. That is, the first and second electrode thin films 410a and 420a are separated from each other while interposing the MIT thin film 300a therebetween. The first electrode thin film 410 and the second electrode thin film 420 together constitute an electrode thin film 400.

The buffer layer 200 reduces a lattice mismatch between the MIT thin film 300a and the substrate 100. If the lattice mismatch between the substrate 100 and the MIT thin film 300a is very small or insignificant, the MIT thin film 300a can be directly formed on the substrate 100 without interposing the buffer layer 200.

The buffer layer 200, the MIT thin film 300a, the electrode thin film 400a, and the substrate 100 can be formed of the materials described with reference to FIG. 1. Moreover, the perpendicular and horizontal MIT devices illustrated in FIGS. 1 and 2A, respectively, can be formed on the scale of microns, and can be fabricated with low fabrication costs.

Figure 2B:
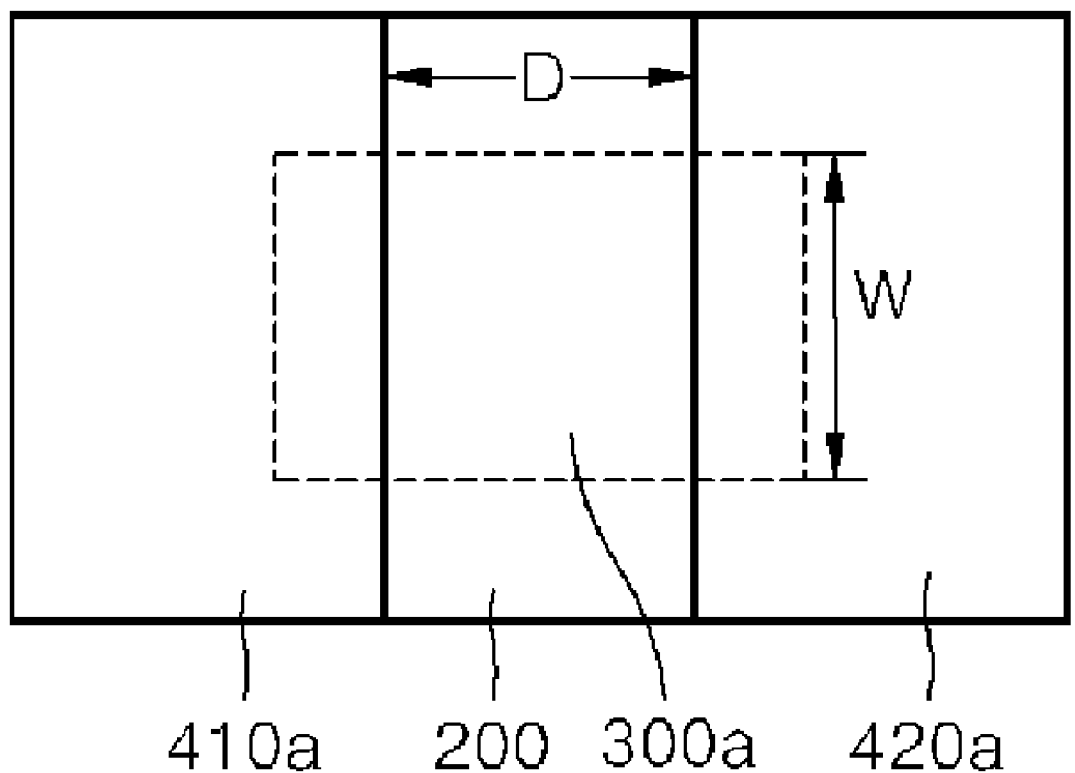

FIG. 2B is a plan view of the horizontal MIT device of FIG. 2A, according to an embodiment of the present invention. Referring to FIG. 2B, the buffer layer 200, the MIT thin film 300a, and the first and second electrode thin films 410a and 420a of the MIT device are shown. As described above, the MIT device generates a discontinuous MIT phenomenon at an MIT generation voltage or higher, and the MIT generation voltage can vary according to the structure of the device. For example, a distance D between the first and second electrode thin films 410a and 420a or a width W of the MIT thin film 300a can be changed in order to change the MIT generation voltage.

The MIT device of the present invention has electric characteristics that are abruptly changed according to an applied voltage. That is, the MIT device shows an insulating property when a lower voltage than the MIT generation voltage is applied thereto, and shows a metal property due to the discontinuous MIT generated at the MIT generation voltage or higher. In general, results of measuring the electric current versus the voltage in cases where the maximum current is restricted and the voltage is increased and where the maximum voltage is restricted and the current is increased are different in the MIT device.

Figure 3A:
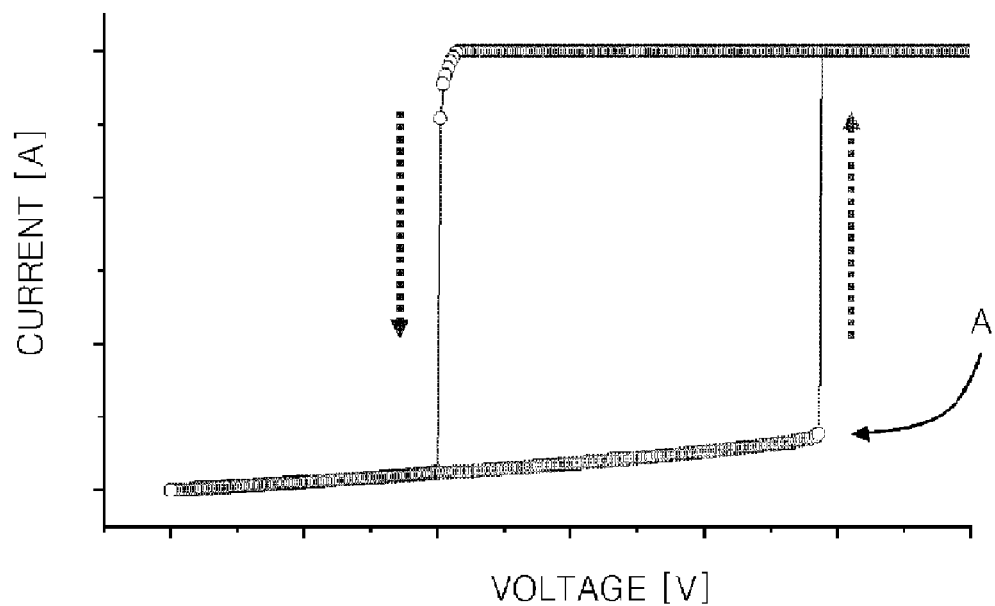
FIGS. 3A and 3B are graphs showing electric current versus voltage characteristics in an MIT device, showing a rapid electric current increase to a certain applied voltage or higher in a voltage mode and a current mode, according to an embodiment of the present invention.

FIG. 3A is a graph showing a current versus voltage characteristic of an MIT device according to the present invention, which is measured in a voltage mode (A), in which the maximum current flowing through the device is restricted and the voltage varies, and showing a current increase abruptly at a certain applied voltage or higher. The MIT device can have a perpendicular structure or a horizontal structure as described above.

Referring to FIG. 3A, the graph shows a relationship between the current versus the voltage that is measured in the voltage mode (A), that is, while increasing the voltage applied to the MIT device in a status in which the maximum current flowing though the MIT device is limited to a predetermined level. As shown in FIG. 3A, the current abruptly increases at a certain voltage, that is, an MIT generation voltage, or higher, a characteristic which is caused by an abrupt reduction in resistance since the MIT device is transited to a metal status from an insulator status. Moreover, in this status, if the applied voltage is reduced, the current is abruptly reduced at a voltage lower than the MIT generation voltage (hereinafter, referred to as 'MIT terminating voltage') with a constant hysteresis width. This characteristic is caused by the rapid increase of the resistance since the MIT device is returned to insulator status.

Figure 3B:
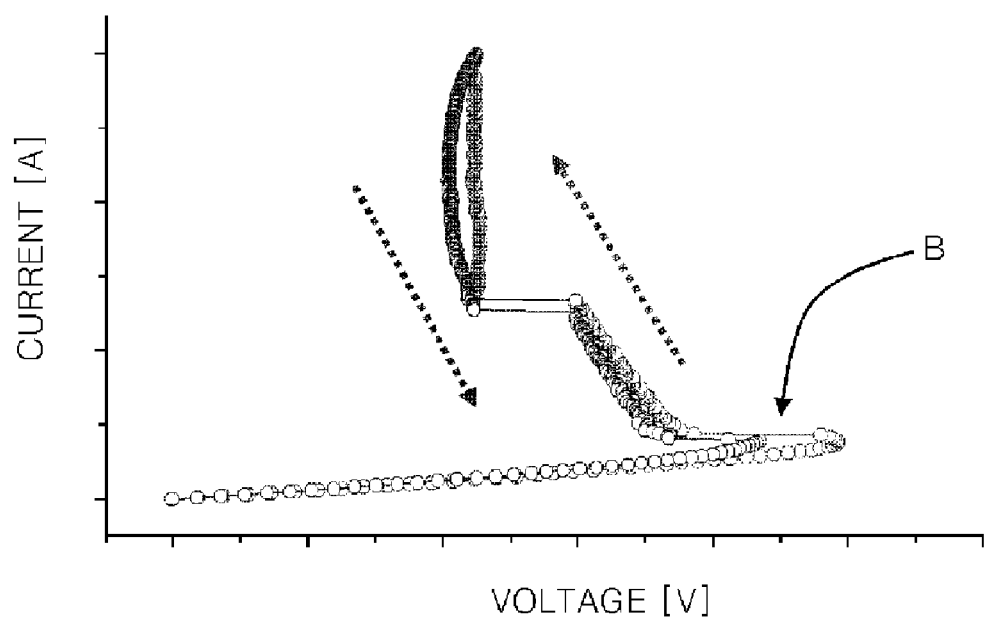

FIG. 3B is a graph showing a current versus voltage characteristic of the MIT device, which is measured in a current mode (B), in which the maximum voltage applied to the device is limited and the current is changed, and showing a abrupt current increase at a certain applied voltage or higher. The MIT device can have a perpendicular structure or a horizontal structure as described above.

Referring to FIG. 3B, the graph shows a relationship between the current versus the voltage that is measured in the current mode (B), that is, while increasing the current flowing through the MIT device in a status in which the maximum voltage applied to the MIT device is limited to a predetermined level. As shown in FIG. 3B, when the voltage (hereafter "Voltage VMIT") applied to the MIT device, which is increased according to the current flowing through the MIT device, reaches the MIT generation voltage, the voltage VMIT is abruptly dropped. Hereinafter, the current flowing through the MIT device at the time when the MIT occurs is defined as the 'MIT oscillating minimum current' (i.e. a lower threshold). Then, when the current flowing through the MIT device increases, a dropping of the voltage VMIT is gradually reduced, and then, the abrupt dropping of the voltage VMIT occurs again at a certain current value. After that, the voltage rarely drops. Hereinafter, the current at the time when the second abrupt voltage drop occurs is defined as the 'MIT oscillating maximum current' (i.e. an upper threshold).

On the other hand, in a case where the current is reduced, the current versus the voltage characteristic shows the opposite status to that of the case where the current increases. That is, the voltage rarely drops at first, then, the voltage rapidly increases around the level of the MIT oscillating maximum current, and then, the voltage gradually increases with the reduction of the current. After that, the voltage rapidly increases at the level of the MIT oscillating minimum current, and then, reduces along with the reduction of the current.

In the current mode (B) shown in FIG. 3B, the hysteresis width is insignificant unlike in the graph shown in FIG. 3A. The MIT device having the above current versus voltage characteristic can form a circuit by being coupled to a resistor having an appropriate resistance, and when a voltage satisfying a certain condition is applied to the circuit including the MIT device, the voltage or current of the MIT device shows an oscillation characteristic. Hereinafter, the oscillation characteristic of the voltage or current generation in the MIT device will be defined as 'MIT oscillation'.

Figure 4:
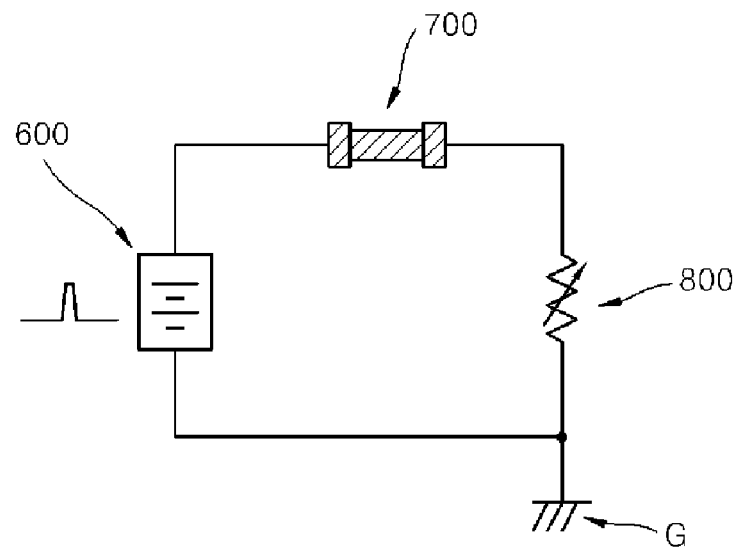
FIG. 4 is a circuit diagram of an oscillation circuit including an MIT device, which can control an oscillation phenomenon and an oscillation frequency by changing an applied voltage or resistance of a power source and a variable resistor included in the oscillation circuit, respectively, according to an embodiment of the present invention.

FIG. 4 is a circuit diagram of an oscillation circuit according to an embodiment of the present invention. The oscillation circuit can control oscillation generation and oscillation frequency by changing the applied voltage or the resistance of the variable resistor 800, according to an embodiment of the present invention.

Referring to FIG. 4, the oscillation circuit according to the current embodiment of the present invention includes an MIT device 700, a variable resistor 800 connected to the MIT device 700 in series, and a power source 600 applying a voltage or supplying an electric current to the MIT device 700. The MIT device 700 can have a perpendicular or horizontal structure as illustrated in FIG. 1 or FIG. 2A.

In the current embodiment, a direct current (DC) short pulse voltage as the power source 600 is used source in order to identify the generation of the oscillation clearly. In a case where an electrical short pulse generated by the short pulse voltage source is used, Joule heat generated by the electric current can be minimized, and thus, damage of the MIT device 700 caused by the Joule heat can be reduced and the controlling of the oscillation generation and the oscillation frequency can be performed accurately.

The power source 600 is not limited to a DC short pulse voltage source, and various kinds of power sources such as a DC voltage source, an AC voltage source, a DC current source, an AC current source, and a pulse current source can be used as the power source 600 of the oscillation circuit.

Although not shown in the drawings, the oscillation circuit of the current embodiment can include at least one of a capacitor and an inductor, which is connected to at least one of the power source 600, the MIT device 700, and the variable resistor 800 in series or in parallel, or in series and in parallel.

In the oscillation circuit having the above structure, a certain condition generating the oscillation of the MIT device 700 is determined first, and then, the condition is applied to the oscillation circuit to generate the MIT oscillation. In general, the generation of the MIT oscillation is determined by whether the voltage applied from the power source 600 and the resistance of the variable resistor 800 satisfy certain conditions or not; however, in a case where a capacitor or inductor is included in the oscillation circuit, the capacitance of the capacitor or the inductance of the inductor can be applied as variables.

Principles of the MIT oscillation will be described in detail as follows. The oscillation circuit includes the variable resistor 800 that is connected to the MIT device 700 in series, and the power source 600 that can apply the short pulse voltage. In the oscillation circuit having the above structure, when a voltage $V_{MIT}$ exceeds the MIT generation voltage and MIT occurs, that is insulator to metal transition, the resistance of the MIT device 700 is abruptly reduced, the current flowing through the oscillation circuit abruptly increases, and at the same time, the voltage $V_{MIT}$ is abruptly reduced. However, as shown in the current mode of FIG. 3A, even if the voltage $V_{MIT}$ is reduced to the MIT terminating voltage, the MIT may not be terminated when the current flowing through the oscillation circuit is greater than the MIT oscillating maximum current.

Therefore, if the appropriate resistance is selected so that the current after generating the MIT can be maintained to be the MIT oscillating maximum current or lower, the current that is abruptly increased after the MIT generation is reduced with a predetermined time constant by the MIT termination caused by the abrupt reduction of the voltage $V_{MIT}$. Here, since the applied voltage of the power source 600 is a constant and the voltage applied to the variable resistor 800 is reduced at a same-phase with the reduction of the current, the voltage $V_{MIT}$ increases again at the same time constant. When the increased voltage exceeds the MIT generation voltage, MIT occurs again, and the resistance of the MIT device is abruptly reduced. Therefore, the current flowing through the oscillation circuit is rapidly increased, and the voltage $V_{MIT}$ is abruptly reduced. After that, the above processes are repeated, and thus, the oscillation can be observed in the voltage $V_{MIT}$ and the current flowing through the oscillation circuit. Here, the time constant is a value obtained by adding a time constant that is obtained from a general RLC circuit to a changed amount of the time constant according to the magnitude of the external voltage, which is caused by an exponential reduction in the current when the MIT is terminated.

As described above, in order to generate the MIT oscillation, an appropriate voltage that can generate the MIT and an appropriate variable resistance that can restrict the current after generating the MIT are required. That is, in order to generate the MIT oscillation in the oscillation circuit according to the current embodiment of the present invention, the following conditions should be satisfied. The voltage $V_{MIT}$ should be equal to the MIT generation voltage or higher, and the current of the oscillation circuit should exist between the MIT oscillating minimum current and the MIT oscillating maximum current after generating the MIT. These conditions can be determined on an X-Y plane having the voltage applied from the power source 600 and the resistance of the variable resistor 800 as two variables.

Figure 5:
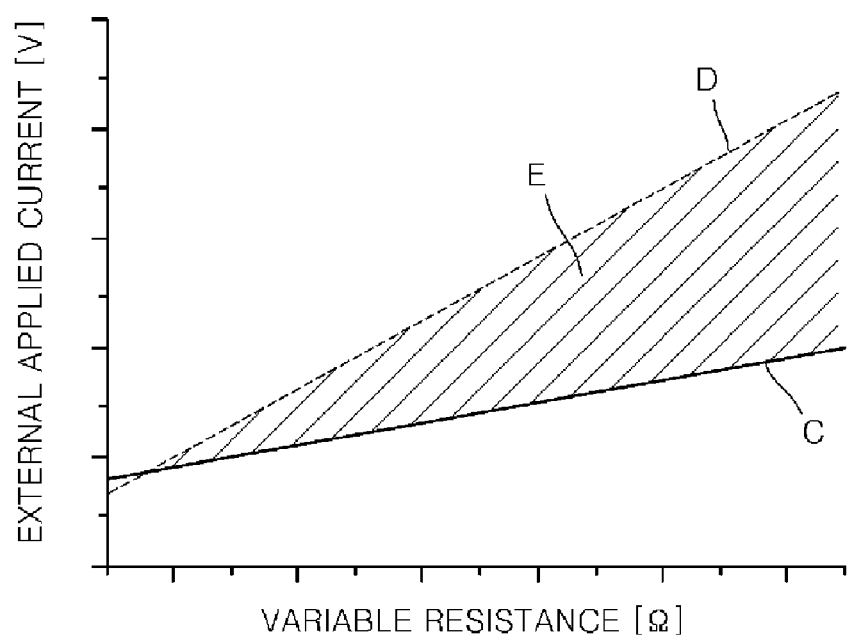
FIG. 5 is a graph showing a region of an X-Y plane satisfying the conditions for applied voltage and resistance, in order to generate the oscillation of voltage or current in the oscillation circuit of FIG. 4, according to an embodiment of the present invention.

FIG. 5 is a graph showing a region satisfying the conditions for applied voltage and resistance, in order to generate the oscillation of the voltage or the current in the oscillation circuit of FIG. 4, according to an embodiment of the present invention. Referring to FIG. 5, the X-Y plane includes two variables, one the voltage applied from the power source 600 and two, the resistance of the variable resistor 800. Here, the X axis denotes the resistance of the variable resistor 800, and the Y axis denotes the voltage applied from the power source 600.

Referring to FIG. 5, the short-pulse applied voltage and the resistance should satisfy the condition that the voltage $V_{MIT}$ is equal to the MIT generation voltage or higher, in order to generate the MIT in the MIT device 700. That is, the applied voltage and the resistance should be located in a region that is above the line C. Additionally, the condition that the current flowing through the oscillation circuit is equal to the MIT oscillating minimum current or higher when the MIT is generated should be satisfied, and this condition is automatically included in the above condition, in which the voltage $V_{MIT}$ is equal to the MIT generation voltage or higher. That is, when the MIT is generated, the condition that the current is equal to the MIT oscillating minimum current is naturally satisfied.

Next, a condition that the short-pulse applied voltage and the resistance should satisfy the condition that the current flowing through the oscillation circuit is equal to the MIT oscillating maximum current or lower after the MIT is generated, so that the MIT can be terminated. That is, the applied voltage and the resistance should be located in a region under the line D.

Consequently, the above conditions for generating the MIT oscillation can be represented as three linear inequalities in two variables, that is, the applied voltage and the resistance, when a non-linear electrical characteristic of the devices is not considered. In addition, an intersection of the inequalities can be represented as an oscillation region E between the line C and the line D on the two dimensional X-Y plane representing the two variables, that is, the applied voltage and the resistance. That is, values of the applied voltage and the resistance existing in the oscillation region E of FIG. 5 only can generate the MIT oscillation. Here, the inequality among the three inequalities, which relates to the MIT oscillating minimum current, is naturally satisfied by the inequality relating to the MIT generation voltage, and thus, it is not shown in FIG. 5.

Moreover, once the oscillation region E is found, the applied voltage and the resistance can be changed in order to continuously adjust the oscillation frequency of the oscillation circuit. That is, after determining the oscillation region E, the applied voltage of the power source 600 and the resistance of the variable resistor 800 can be changed within the oscillation region E, and thus, the oscillation frequency can be changed. If a capacitor or an inductor is included in the oscillation circuit, the oscillation frequency of the oscillation circuit also can be changed by changing the capacitance or the inductance, and in this case, the oscillation region E becomes a two or more dimensional region.

Following voltage, current, resistance, and time are examples for describing the MIT oscillation in the present invention, and the above examples do not limit the scope of the present invention.

Methods of adjusting the oscillation frequency in the MIT oscillation are as follows. As described above, when an appropriate resistance is selected so that the current flowing through the oscillation circuit after generating the MIT can be maintained to be the MIT oscillating maximum current or lower, the current that is abruptly increased after the MIT generation can be reduced with a time constant when the voltage $V_{MIT}$ is abruptly reduced and the MIT is terminated. At the same time, when the increasing voltage $V_{MIT}$ reaches the MIT generation voltage, the MIT is generated again. Therefore, the oscillation frequency is determined by the time taken by the voltage $V_{MIT}$ that is abruptly reduced after the MIT generation to reach the MIT generation voltage (hereinafter, referred to as 'MIT recovering time'), and the MIT recovering time is determined by the time constant that is calculated from the magnitude of the voltage applied from the power source 600, the resistance of the variable resistor 800, an internal resistance and an electrical capacitance of the MIT device 700.

Therefore, the MIT recovering time can be adjusted by changing the applied voltage and the resistance within the MIT oscillating region E of FIG. 5, and thus, the oscillation frequency of the current flowing through the oscillation circuit can be adjusted by changing the applied voltage and the resistance within the oscillation region E. In addition, since at least one of a capacitor and an inductor connected to devices of the oscillation circuit in series and/or in parallel can be components for determining the time constant, the capacitor and/or the inductor can affect the MIT recovering time. Therefore, in a case where a capacitor and/or an inductor is additionally included in the oscillation circuit, the oscillation frequency can be adjusted by changing the capacitance and/or the inductance.

Figure 6A:
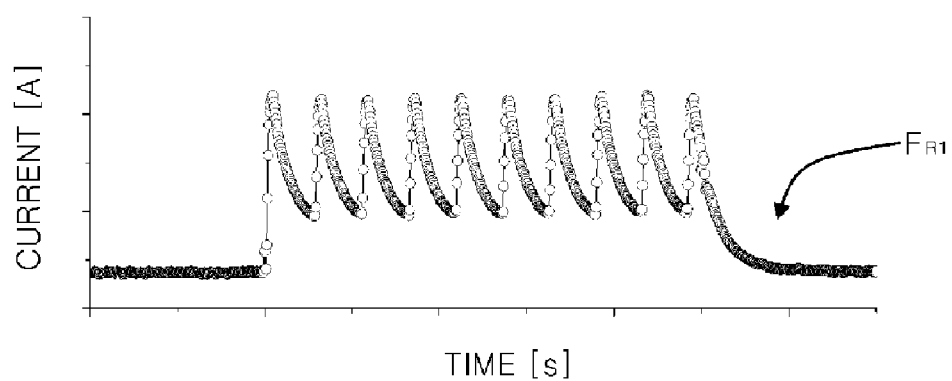
FIGS. 6A through 6C are graphs showing changes in oscillation frequencies of current oscillation waveforms that are generated when the applied voltage of the power source is fixed and the resistance of the variable resistor is varied, according to an embodiment of the present invention.
Figure 6B:
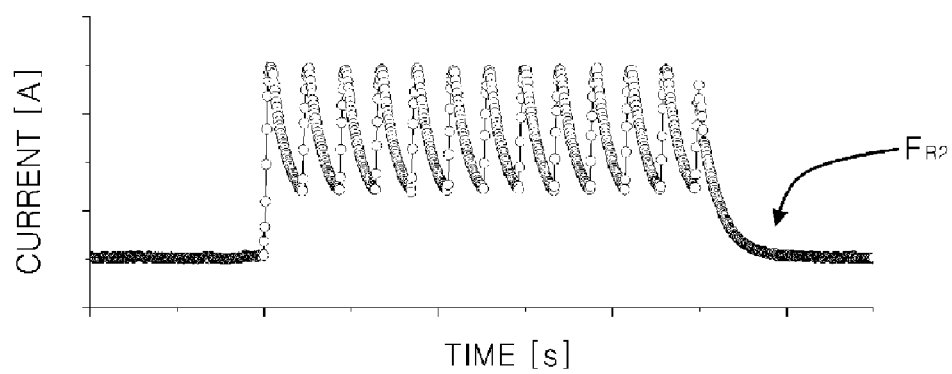
Figure 6C:
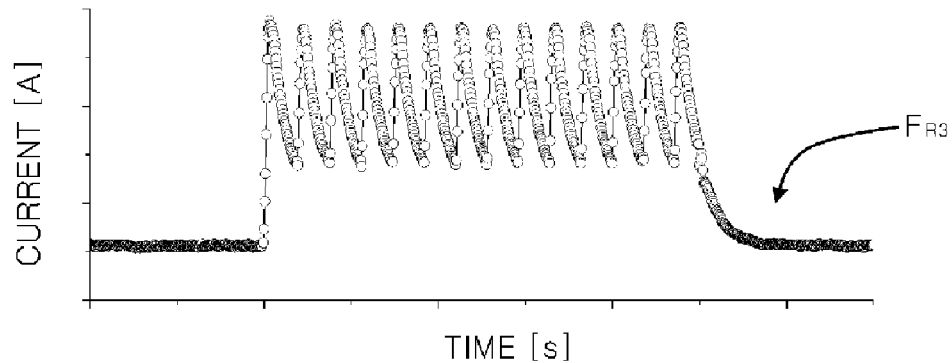

FIGS. 6A through 6C are graphs showing changes of the oscillation frequency in the current oscillation waveform that is generated when the applied voltage of the power source 600 is fixed and the resistance of the variable resistor 800 is changed, according to an embodiment of the present invention. Here, the voltage applied from the power source 600 is fixed as a certain value within the oscillating region E shown in FIG. 5, and the resistance of the variable resistor 800 is changed within the oscillating region E.

FIG. 6A shows an oscillation waveform $F_{R1}$ generated with a resistance R1 within the oscillating region E, and FIGS. 6B and 6C are graphs showing oscillation waveforms $F_{R2}$ and $F_{R3}$ generated with resistances R2 and R3 that are obtained by subtracting a predetermined resistance N from the resistance R1. That is, R2 is equal to R1−N, and R3 is equal to R1−2N. Here, a unit for the resistance is Ω.

Referring to FIGS. 6A through 6C, the oscillation frequency of the oscillation waveform of the current is changed according to the change in the resistance of the variable resistor 800. That is, when the resistance of the variable resistor 800 is reduced, the oscillation frequency is increased, and since the time constant is reduced due to the reduction of the resistance, the MIT recovering time is reduced.

Figure 7A:
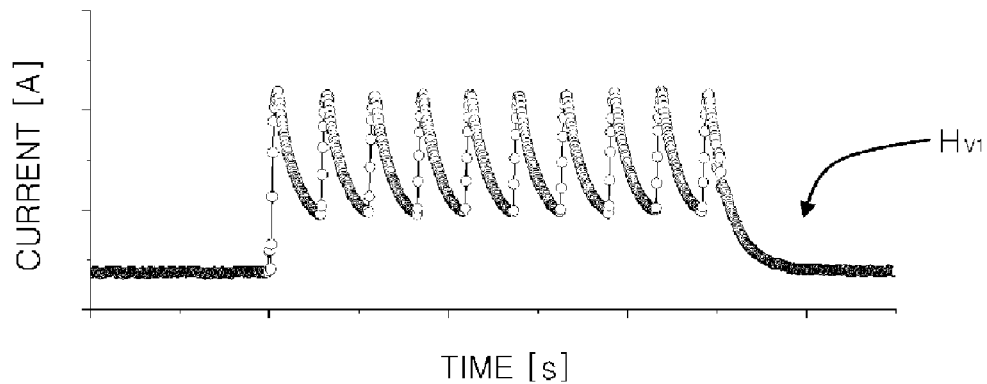
FIGS. 7A through 7C are graphs showing changes in oscillation frequencies of current oscillation waveforms that are generated when the resistance of the variable resistor is fixed and the applied voltage is varied.
Figure 7B:
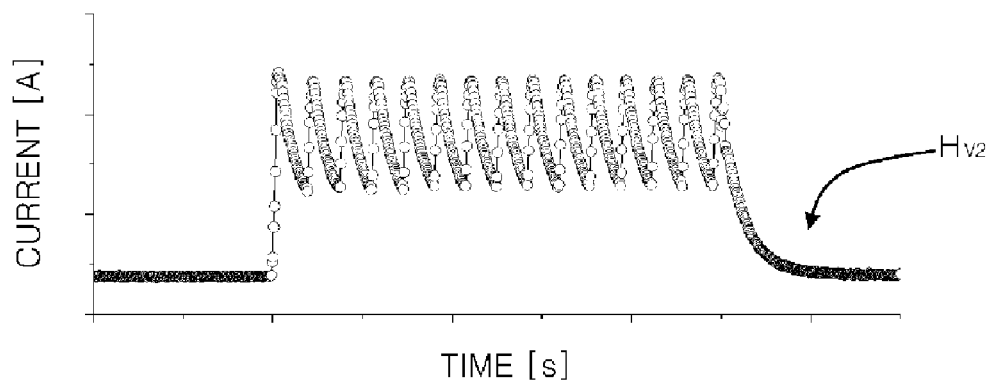
Figure 7C:
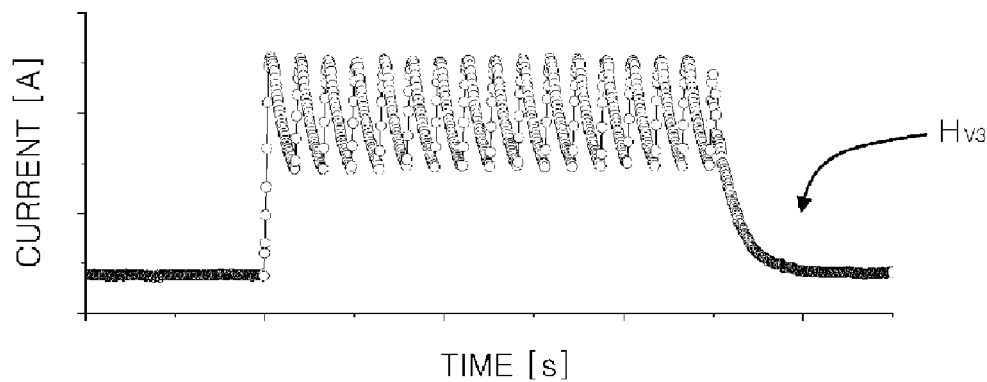

FIGS. 7A through 7C are graphs showing changes in current oscillation waveforms that are generated when the resistance of the variable resistor 800 is fixed and the applied voltage of the power source 600 is changed. Here, the resistance of the variable resistor 800 is fixed as a certain value within the oscillating region E shown in FIG. 5, and the voltage applied from the power source 600 is changed within the oscillating region E shown in FIG. 5.

FIG. 7A is a graph showing an oscillation waveform $H_{V1}$ generated with an applied voltage V1 (not shown in drawings) in the MIT oscillating region E, and FIGS. 7B and 7C are graphs showing oscillation waveforms $H_{V2}$ and $H_{V3}$ generated with an applied voltages that are increased by a predetermined voltage M from the applied voltage V1. That is, V2 is equal to V1+M, and V3 is equal to V1+2M. Here, a unit for the voltage is V.

As shown in FIGS. 7A through 7C, the oscillation frequency of the oscillation waveform of the current is changed according to the change in the voltage applied from the power source 600. That is, when the applied voltage increases, the oscillation frequency is also increased, and since the voltage applied to the MIT device 700 within the same time is increased due to the increase of the applied voltage, the MIT recovering time is reduced.

Referring to FIGS. 6 and 7, in the oscillation circuit including the MIT device 700 that can adjust the oscillation frequency, according to an embodiment of the present invention, the oscillation circuit is constructed only by connecting the MIT device 700 to the variable resistor 800, and then such applied voltage from the power source 600 and the resistance of the variable resistor 800 are continuously changed within the oscillating region E in order to adjust the oscillation frequency of the MIT oscillation continuously. Although not shown in the drawings, in a case where at least one of a capacitor and an inductor is included in the oscillation circuit, the capacitance and/or the inductance can be changed in order to adjust the oscillation frequency.

Therefore, the MIT device based oscillation circuit provided by the present invention can be directly applied to an electronic device such as an inverter or an oscillator, and can generate the oscillation phenomenon easily without using various electronic devices such as a transistor, capacitor, or inductor. In particular, the oscillation frequency can be continuously adjusted by changing the applied voltage or the resistance, and thus, the oscillation circuit of the present invention can be useful in an electronic device, an electronic apparatus, or an electronic system requiring a wide oscillation frequency band. For example, the electronic device, apparatus, or system using the MIT device based oscillation circuit of the present invention can be an MIT battery, MIT illumination device, MIT sensor, MIT two-terminal switching device, MIT three-terminal switching device (transistor), MIT memory, MIT oscillator, or MIT radio frequency (RF) device.

Moreover, when the MIT device based oscillation circuit of the present invention is compared with a conventional oscillation device using an oxide semiconductor or an organic material, the MIT device based oscillation circuit can continuously adjust the oscillation frequency only by changing the applied voltage and the resistance, and can generate an oscillation waveform that is nearly ramp-shaped according to the discontinuous increase of the current at room temperature, and not a continuous sine wave. In addition, the oscillation phenomenon having the discontinuous waveform cannot be observed in a conventional oscillation circuit including at least one of a resistor, capacitor, and inductor. Moreover, the oscillation circuit of the present invention can generate an oscillation frequency that is 10 to 1000 times higher than an oscillation frequency of a conventional oscillation circuit at room temperature. For example, the oscillation circuit of the present invention can generate an oscillation frequency of hundreds of kHz, and can control the frequency continuously.

As described above, according to the MIT device based oscillation circuit that can adjust the oscillation frequency and the method of adjusting the oscillation frequency of the present invention, the applied voltage or the resistance are controlled according to certain conditions in order to generate and terminate the oscillation and to continuously change the oscillation frequency. The conditions of generating the oscillation and the method of adjusting the oscillation frequency can be applied to all kinds of oscillation circuits including MIT devices in order to generate oscillation and adjust the oscillation frequency.

Therefore, the present invention can be directly applied to an inverter or an oscillator, and can be useful in an electronic device, apparatus, or system requiring a wide oscillation frequency band. In addition, the present invention also can be applied in devices using MIT such as MIT solar batteries and MIT illumination devices.

Moreover, in order to form an inverter or oscillator, many electronic devices such as an amplifier, a switching circuit, and a feedback loop are required; however, the MIT device based oscillation circuit according to the present invention can easily obtain the oscillation characteristic only by connecting a variable resistor to the MIT device. In particular, a high oscillation frequency of hundreds of kHz can be generated by changing the applied voltage or the resistance of the variable resistor, and the such oscillation frequency can be adjusted continuously.

While the present invention has been particularly shown and described with reference to exemplary embodiments thereof, it will be understood by those of ordinary skill in the art that various changes in form and details may be made therein without departing from the spirit and scope of the present invention as defined by the following claims.

INDUSTRIAL APPLICABILITY

The present invention relates to a metal-insulator transition (MIT) device. According to the MIT device based oscillation circuit that can adjust the oscillation frequency and the method of adjusting the oscillation frequency of the present invention, the applied voltage or the resistance are controlled according to certain conditions in order to generate and terminate the oscillation and to continuously change the oscillation frequency.

The invention claimed is:

1. A metal-insulator transition (MIT) device-based oscillation circuit comprising:
    an MIT device including an MIT thin film and an electrode thin film connected to the MIT thin film, the MIT device having such characteristics that
        an electric current flowing through the MIT device increases abruptly as an applied voltage increases to an MIT generation voltage, and
        the applied voltage decreases abruptly as the electric current increases to a lower threshold, and decreases further abruptly as the electric current increases to an upper threshold higher than the lower threshold;
    a variable resistor connected in series with the MIT device; and
    a power source applying the voltage or the electric current to the MIT device, such that the applied voltage is equal to or higher than the MIT generation voltage, and the electric current is between the lower threshold and the upper threshold, so as to generate oscillation in the oscillation circuit.

2. The oscillation circuit of claim 1, further comprising:
at least one of a capacitor and an inductor that is connected to at least one of the power source, the MIT device, and the variable resistor in series or in parallel, or in series and in parallel.

3. The oscillation circuit of claim 1, wherein the power source is one selected from a direct current (DC) voltage source, an alternating current (AC) voltage source, a pulse voltage source, a DC current source, an AC current source, and a pulse current source.

4. The oscillation circuit of claim 1, wherein the frequency of the oscillation generated in the oscillation circuit varies according to a change in at least one of the applied voltage and the resistance of the resistor.

5. The oscillation circuit of claim 1, further comprising:
at least one of a capacitor and an inductor that is connected to at least one of the power source, the MIT device, and the variable resistor in series or in parallel, or in series and in parallel,
wherein the frequency of the oscillation in the oscillation circuit varies according to a change in at least one of the capacitance of the capacitor and the inductance of the inductor.

6. The oscillation circuit of claim 1, wherein the electrode thin film includes a first electrode thin film and a second electrode thin film, and the MIT device further comprises:
a substrate;
the first electrode thin film formed on the substrate;
the MIT thin film formed on the first electrode thin film, and comprising a low hole concentration; and
the second electrode thin film formed on the MIT thin film.

7. The oscillation circuit of claim 1, wherein the electrode thin film includes a first electrode thin film and a second electrode thin film, and the MIT device comprises:
a substrate;
the MIT thin film formed on a part of an upper surface of the substrate, and comprising a low hole concentration;
the first electrode thin film formed on a first side surface and a portion of an upper surface of the MIT thin film on the substrate; and
the second electrode thin film formed on a second side surface and another portion of the upper surface of the MIT thin film on the substrate.

8. The oscillation circuit of claim 1, wherein the MIT thin film comprises at least a material selected from oxide layer materials comprising at least one of $Al_2O_3$, $VO_2$, $V_2O_3$, $ZrO_2$, ZnO, $HfO_2$, CuO, $Ta_2O_5$, $La_2O_3$, $Fe_2O_3$, NiO, and MgO, oxide layer materials comprising at least one of AlxTiyO, ZnxTiyO, ZrxTiyO, TaxTiyO, VxTiyO, LaxTiyO, BaxTiyO, and SrxTiyO, and semiconductor materials comprising at least one of GaAS, GaSb, InP, InAs, GST (GeSbTe), Si, and Ge.

9. The oscillation circuit of claim 1, wherein the MIT thin film comprises at least one of a p-type inorganic semiconductor, a p-type inorganic insulator, a p-type organic semiconductor, and a p-type organic insulator having a low hole concentration.

10. The oscillation circuit of claim 9, wherein the MIT thin film comprises at least one of oxygen, carbon, Si, Ge, a Group III-V semiconductor compound, a Group II-VI semiconductor compound, a transition metal element, a rare earth element, and a lanthanium-based element.

11. The oscillation circuit of claim 1, wherein the MIT thin film comprises an n-type semiconductor and an insulator.

12. The oscillation circuit of claim 1, wherein the electrode thin film comprises a material comprising at least one of Al, Cu, Ni, W, Mo, Cr, Zn, Mg, Fe, Co, Sn, Pb, Au, Ag, Pt, Ti, Ta, TaN, TaW, WN, TiN, TiW, poly-Si and IrO, RuO, InSnO(InO:Sn), and ZnO.

13. The oscillation circuit of claim 1, wherein the oscillation circuit is used in an electronic device, an electronic apparatus, or an electronic system requiring an oscillation characteristic having a wide frequency band.

14. The oscillation circuit of claim 13, wherein the electronic device, the electronic apparatus, or the electronic system comprises at least one of an MIT battery, an MIT light emission device, an MIT sensor, an MIT two-terminal switching device, an MIT three-terminal switching device (transistor), an MIT memory, an MIT oscillator, and an MIT radio frequency (RF) device.

15. A method of adjusting an oscillation frequency of
an oscillation circuit, that includes
an MIT device having such characteristics that
an electric current flowing through the MIT device increases abruptly as an applied voltage increases to an MIT generation voltage, and
the applied voltage decreases abruptly as the electric current increases to a lower threshold, and decreases further abruptly as the electric current increases to an upper threshold higher than the lower threshold;
a variable resistor connected in series with the MIT device; and
a power source applying the voltage or the electric current to the MIT device,
the method comprising:
controlling a generation of an oscillation in the oscillation circuit and adjusting the oscillation frequency in the oscillation circuit by controlling the applied voltage of the power source or the resistance of the variable resistor, so that the voltage applied on the MIT device is equal to or higher than the MIT generation voltage, and the electric current flowing through the MIT device is between the lower threshold and the upper threshold.

16. The method of claim 15, wherein the power source is one selected from a DC voltage source, an AC voltage source, a pulse voltage source, a DC current source, an AC current source, and a pulse current source, and the power source applies one of a DC voltage, an AC voltage, a pulse voltage, an DC current, an AC current, and a pulse current to the MIT device.

17. The method of claim 15, wherein the oscillation circuit further includes at least one of a capacitor and an inductor that is connected to at least one of the power source, the MIT device, and the variable resistor in series or in parallel, or in series and in parallel, and the adjusting the oscillation frequency includes changing at least one of the capacitance of the capacitor and the inductance of the inductor.

* * * * *